(12) United States Patent
Wu (10) Patent No.: US 7,948,294 B2
(45) Date of Patent: May 24, 2011

(54) MIXER WITH HIGH LINEARITY

(75) Inventor: Chia-Hsin Wu, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 102 days.

(21) Appl. No.: 12/474,456

(22) Filed: May 29, 2009

(65) Prior Publication Data

US 2010/0301920 A1    Dec. 2, 2010

(51) Int. Cl.
  *G06G 7/16* (2006.01)
  *H04B 1/28* (2006.01)
(52) U.S. Cl. ........ 327/359; 327/355; 327/356; 455/323; 455/326; 455/333
(58) Field of Classification Search .......... 327/355–361; 455/296, 313, 317, 323, 326, 333
See application file for complete search history.

(56) References Cited

U.S. PATENT DOCUMENTS

| | | | |
|---|---|---|---|
| 6,636,115 B2 | 10/2003 | Kim et al. | |
| 6,983,135 B1 * | 1/2006 | Tsai et al. | 455/234.1 |
| 7,016,664 B2 | 3/2006 | Souetinov | |
| 7,164,321 B2 | 1/2007 | Behzad | |
| 7,177,620 B1 * | 2/2007 | Tsai et al. | 455/333 |
| 7,362,183 B2 * | 4/2008 | Kim et al. | 330/311 |
| 7,417,486 B2 * | 8/2008 | Koutani et al. | 327/359 |
| 7,696,828 B2 * | 4/2010 | Chang | 330/311 |
| 2008/0284489 A1 | 11/2008 | Low | |
| 2009/0111420 A1 * | 4/2009 | Tasic et al. | 455/334 |
| 2009/0258624 A1 * | 10/2009 | Gudem et al. | 455/234.1 |

\* cited by examiner

*Primary Examiner* — Lincoln Donovan
*Assistant Examiner* — Patrick O'Neill
(74) *Attorney, Agent, or Firm* — Thomas | Kayden (57) ABSTRACT

A mixer is provided. The transconductance stage receives an input signal through an input node and outputs an output signal through an output node. The transconductance stage includes a first transistor coupled between the output node and a first power node, having a first gate coupled to the input node, and operating in a saturation region, a second transistor coupled to the first power node, having a second gate coupled to the input node, and operating in a sub-threshold region, a first biasing circuit providing a first bias voltage, and a third transistor coupled between the output node and the second transistor, and having a third gate coupled to the first bias voltage. The switching quad is coupled to the output node and generates a translation current according to the output signal. The transimpedance amplifier transforms the translation current to a corresponding voltage.

20 Claims, 7 Drawing Sheets

MIXER WITH HIGH LINEARITY

BACKGROUND OF THE INVENTION

1. Field of the Invention

The invention relates to a transconductor and a mixer circuit and, in particular, to a mixer circuit with improved linearity.

2. Description of the Related Art

Mixer circuits for high frequency applications constructed using metal oxide semiconductor (MOS) transistors are subject to a limited voltage supply (usually less than 2V) and high levels of flicker noise, having frequencies extending up to several hundreds of KHz. Accordingly, the gain and output signal level required by such mixer circuits exceed those required in equivalent bipolar circuits.

Figure 1:
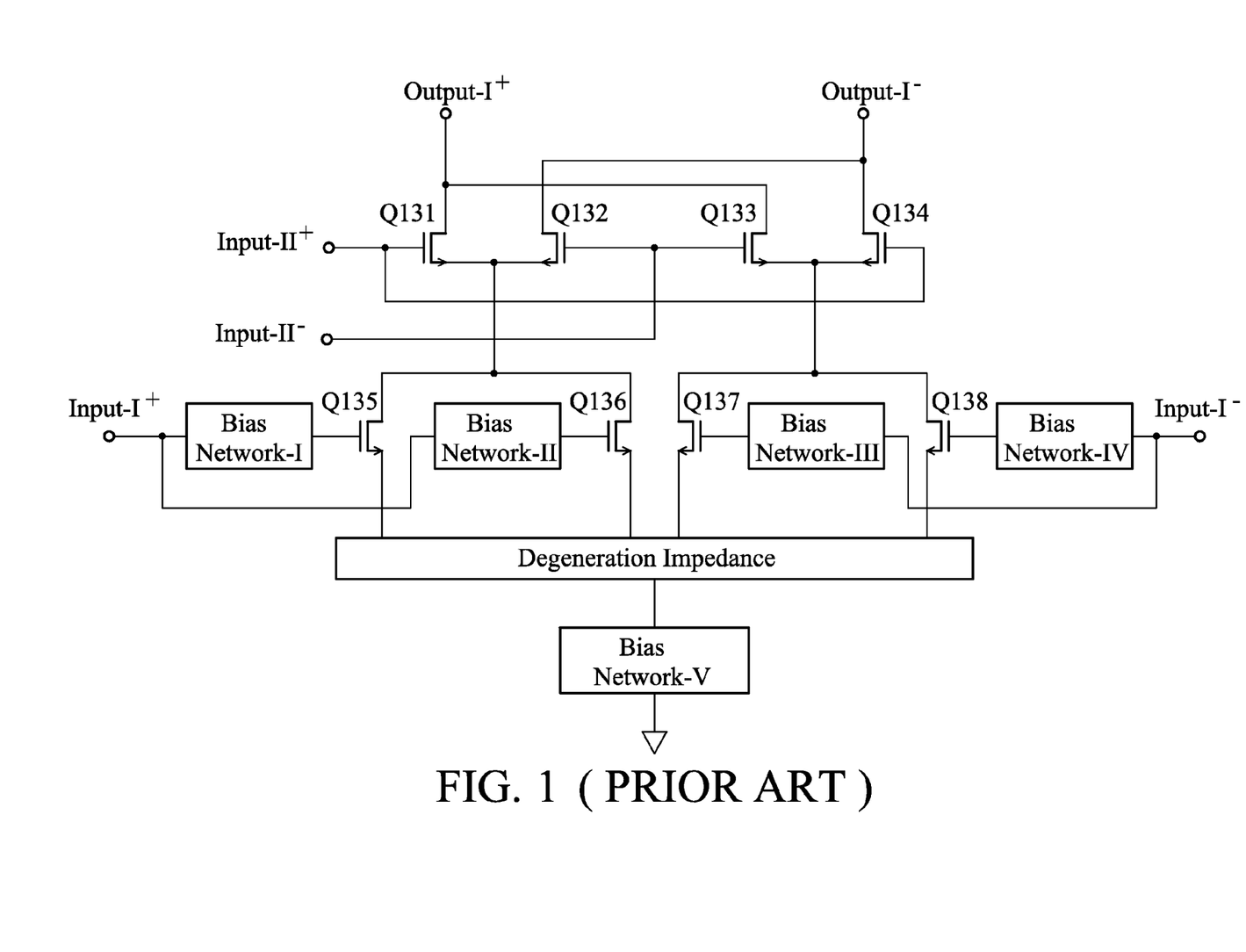
FIG. 1 is a circuit diagram illustrating a conventional double balanced mixer circuit disclosed in U.S. Pat. No. 6,636,115.

FIG. 1 is a circuit diagram illustrating a conventional double balanced mixer circuit. The double balanced mixer circuit of FIG. 1 includes differential pairs of MOSFETs (Q131-Q132 and Q133-Q134). The drains of the pairs of MOSFETs are connected to an output terminal (Output-I$^+$ and Output-I$^-$). The gates of the pairs of MOSFETs are connected to first input terminals (Input-II$^+$ and Input-II$^-$). The double balanced mixer circuit in FIG. 1 also includes active devices Q135, Q136, Q137 and Q138. The sources of the MOSFET pair Q131-Q132 are connected to the drains of the active devices Q135 and Q136. The sources of the MOSFET pair Q133-Q134 are connected to the drains of the active devices Q137 and Q138. The gates of the active devices Q135, Q136, Q137 and Q138 are connected to the second input terminal (Input-I$^+$ and Input-I$^-$) through the input side biasing and matching circuits (Bias Network-I, Bias Network-II, Bias Network-III and Bias Network-IV, respectively). The sources of the active devices Q135, Q136, Q137 and Q138 are connected to the ground through an impedance unit (Degeneration Impedance) and Bias Network-V.

Two separate bias networks (Bias Network-I and Bias Network-II) are respectively provided for the MOSFETs Q135 and Q136, such that the gate to source bias voltages (Vgs) thereof are different. Due to the different gate to source bias voltages (Vgs), the MOSFETs Q135 and Q136 respectively operate in a saturation region and a sub-threshold region. However, complicated circuit design is required to maintain the device model operated in proper operation region to achieve non-linearity cancellation. Therefore the gate to source bias voltage (Vgs) applied to the circuit is limited to a small range.

BRIEF SUMMARY OF THE INVENTION

An exemplary embodiment of a mixer comprises a transconductance stage receiving an input signal through an input node and outputting an output signal through an output node, wherein the transconductance stage comprises: a first transistor coupled between the output node and a first power node, having a first gate coupled to the input node, and operating in a saturation region; a second transistor coupled to the first power node, having a second gate coupled to the input node, and operating in a sub-threshold region; a first biasing circuit providing a first bias voltage; and a third transistor coupled between the output node and the second transistor, and having a third gate coupled to the first bias voltage; a switching quad coupled to the output node and generating a translation current according to the output signal; and a transimpedance amplifier transforming the translation current to a corresponding voltage.

Another exemplary embodiment of a mixer comprises a transconductance stage comprising a first sub-transconductance stage receiving a first input signal through a first input node and outputting a first output signal through a first output node, and a second sub-transconductance stage receiving a second input signal through a second input node and outputting a second output signal through a second output node, wherein the first sub-transconductance stage comprises: a first transistor coupled between the first output node and a first power node, having a first gate coupled to the first input node, and operating in a saturation region; and a second transistor coupled to the first power node, having a second gate coupled to the first input node, and operating in a sub-threshold region; a first biasing circuit providing a first bias voltage; a third transistor coupled between the first output node and the second transistor, and having a third gate coupled to the first bias voltage; a first switching quad coupled to the first output node and the second output node, generating a first translation current according to the first output signal and the second output signal; a second switching quad coupled to the first output node and the second output node, generating a second translation current according to the first output signal and the second output signal; a second transimpedance amplifier transforming the second translation current to a second corresponding voltage; and a first transimpedance amplifier transforming the first translation current to a first corresponding voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
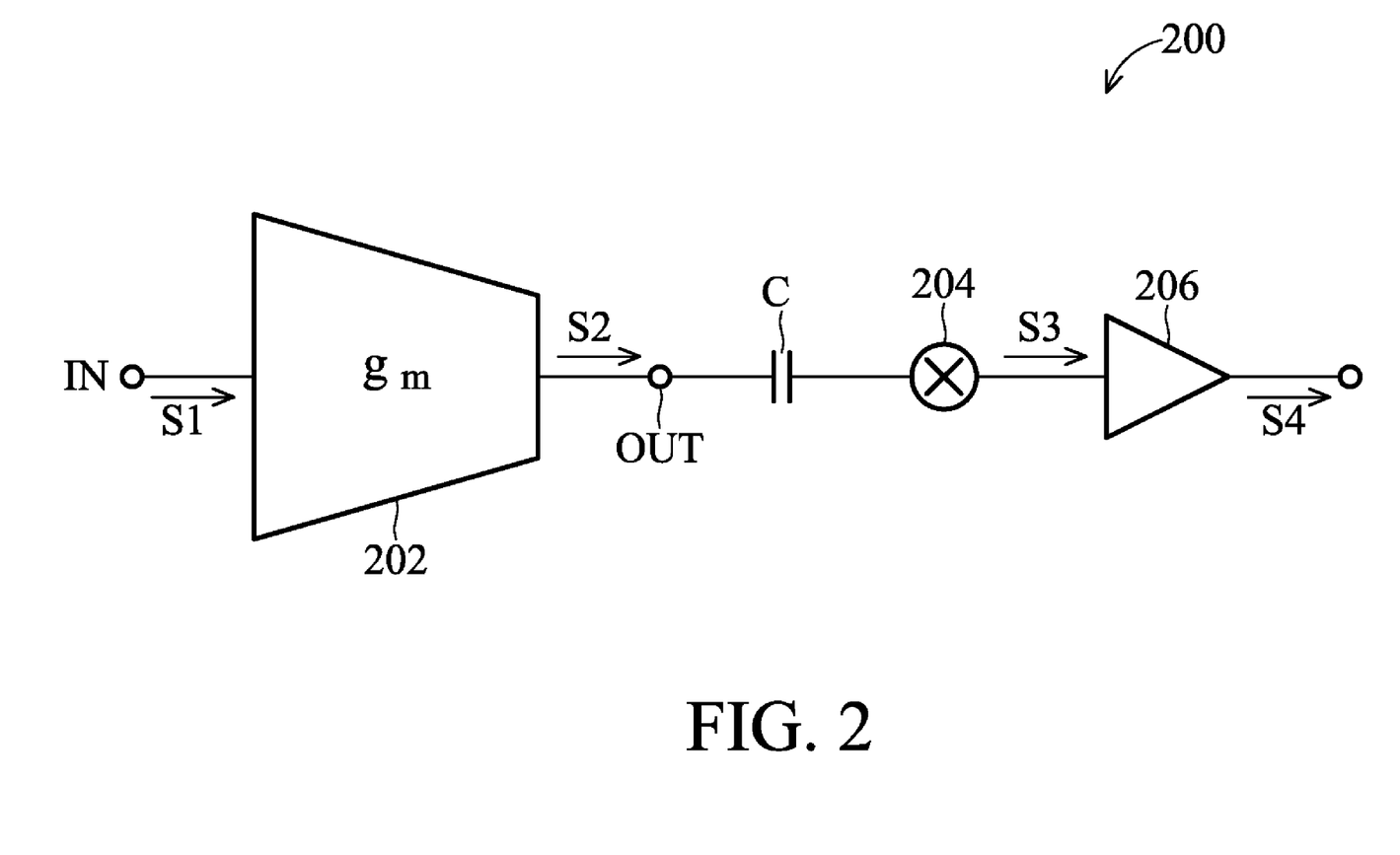
FIG. 2 is a schematic diagram of a mixer according to an embodiment of the invention.

FIG. 2 is a schematic diagram of a mixer according to an embodiment of the invention. The mixer 200 comprises a transconductance stage (gm) 202, a switching quad 204, and a transimpedance amplifier (TZ) 206. The transconductance stage 202 receives the input signal S1 through the input node IN and outputs an output signal S2 through the output node OUT. A switching quad 204 is coupled to the output node OUT and generates a translation current S3 according to the output signal S2. The transimpedance amplifier 206 transforms the translation current S3 to a corresponding voltage S4. The capacitor C is coupled between the output node OUT and the switching quad 204 for coupling the AC component of the output signal S2 to the switching quad 204.

Figure 3A:
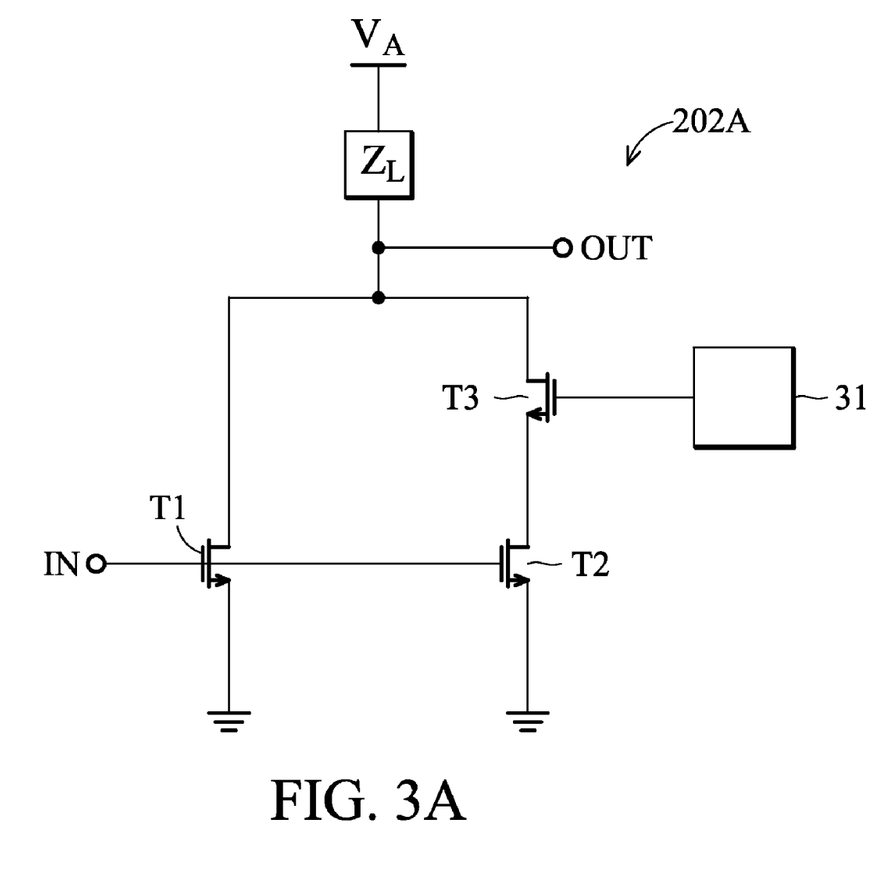
FIG. 3A is a schematic diagram of a transconductance stage 202A according to an embodiment of the invention.

FIG. 3A is a schematic diagram of a transconductance stage 202A according to an embodiment of the invention. A first transistor T1 is coupled between a power node and the output node OUT. The power node can be a ground node. The first transistor T1 can be an NMOS transistor, comprising a gate coupled to the input node IN, a drain coupled to the output node OUT, and a source coupled to the ground node. Note that the first transistor T1 is operating in a saturation region. A second transistor T2 is coupled to the power node (ground node). The second transistor T2 can be an NMOS transistor, comprising a gate coupled to the input node IN, a drain coupled to the third transistor T3, and a source coupled to the ground node. Note that the second transistor T2 is operating in a sub-threshold region. A third transistor T3 can be an NMOS transistor, comprising a gate receives a bias voltage bias provided by a first biasing circuit 31, a source coupled to the drain of the second transistor T2, and a drain coupled to the output node OUT. It is noted that there is a load impedance device $Z_L$ coupled between the output node OUT and a positive voltage node $V_A$, wherein the $Z_L$ can be implemented by a resistor or a capacitor (not shown).

Figure 3B:
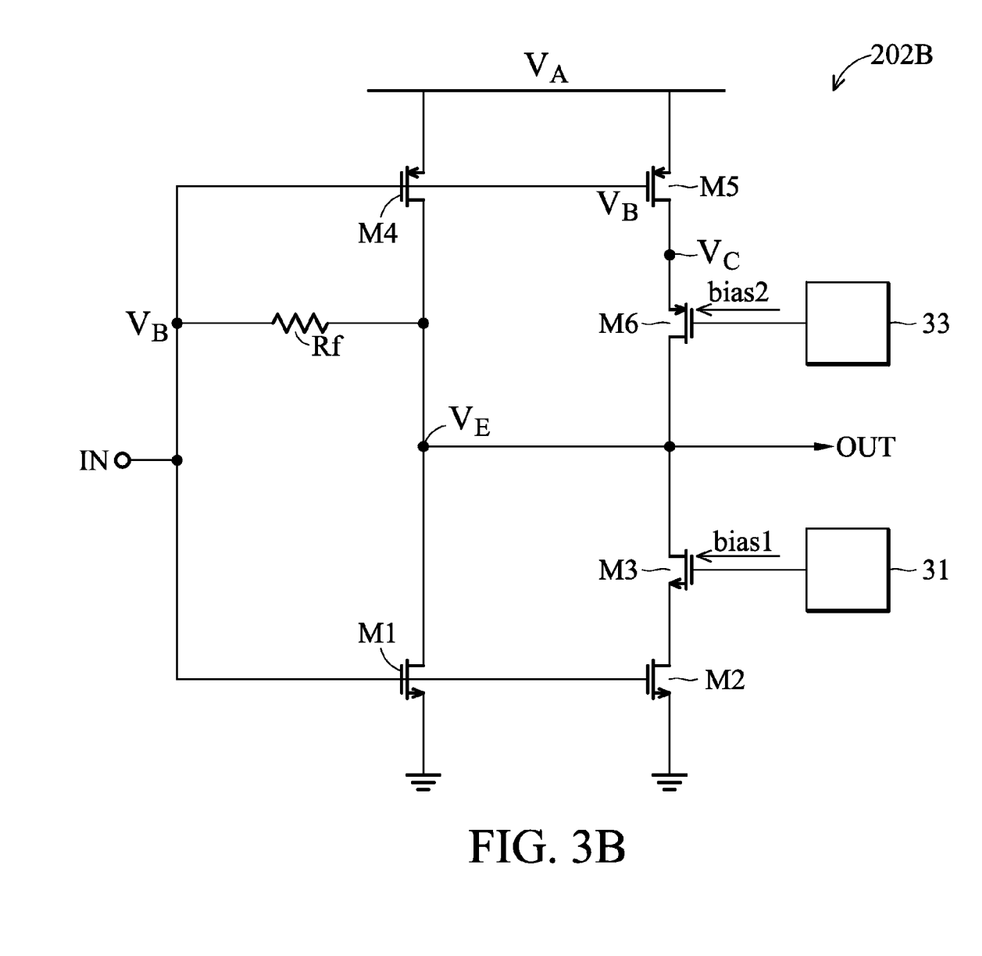
FIG. 3B is a schematic diagram of a transconductance stage 202B according to another embodiment of the invention.

FIG. 3B is a schematic diagram of a transconductance stage 202B according to another embodiment of the invention. A first transistor M1 is coupled between a first power node and the output node OUT. The first power node can be a ground node. The first transistor M1 can be an NMOS transistor, comprising a gate coupled to the input node IN, a drain coupled to the output node OUT, and a source coupled to the ground node. Note that the first transistor M1 is operating in a saturation region. A second transistor M2 is coupled to the first power node (ground node). The second transistor M2 can be an NMOS transistor, comprising a gate coupled to the input node IN, a drain coupled to the third transistor M3, and a source coupled to the ground node. Note that the second transistor M2 is operating in a sub-threshold region. A third transistor M3 can be an NMOS transistor, comprising a gate receives a first bias voltage bias1 provided by a first biasing circuit 31, a source coupled to the drain of the second transistor M2, and a drain coupled to the output node OUT.

A fourth transistor M4 can be a PMOS transistor, comprising a gate coupled to the input node IN, a drain coupled to the output node OUT, and a source coupled to a second power node. The second power node can be a positive voltage node $V_A$. Note that the fourth transistor M4 is operating in the saturation region. A fifth transistor M5 can be a PMOS transistor, comprising a gate coupled to the input node IN, a source coupled to the positive voltage node $V_A$, and a drain coupled to a sixth transistor M6. Note that the fifth transistor M5 is operating in the sub-threshold region. A sixth transistor M6 can be a PMOS transistor, comprising a gate receives a second bias voltage bias2 provided by a second biasing circuit 33, a source coupled to the drain of the fifth transistor M5, and a drain coupled to the output node OUT. A feedback resistor Rf is coupled between the output node OUT and the input node IN. In this embodiment, the complementary structure obtains high transconductance and constant DC operating point with the feedback resistor Rf. Moreover, the first biasing circuit 31 and second biasing circuit 33 operates independently in the embodiment of the invention.

Figure 4A:
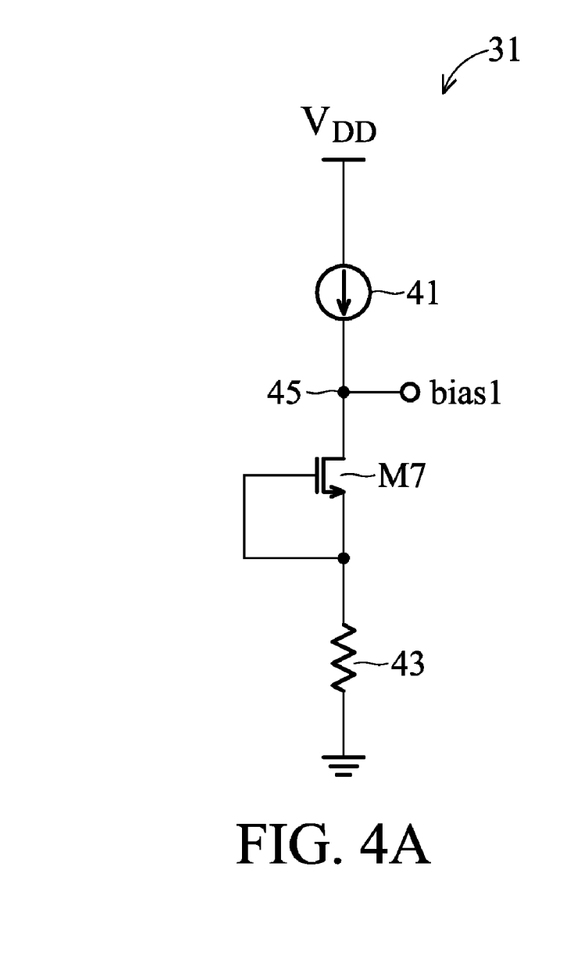
FIG. 4A is a schematic diagram of a first biasing circuit 31 according to an embodiment of the invention.

FIG. 4A is a schematic diagram of a first biasing circuit 31 shown in FIGS. 3A and 3B according to an embodiment of the invention. The first biasing circuit 31 comprises a first current source 41, a first resistor 43, and a seventh transistor M7. The first current source 41 is coupled to the positive voltage node $V_{DD}$. The positive voltage nodes $V_{DD}$ of FIG. 4A and $V_A$ of FIG. 3B can be identical or different voltage levels. The first resistor 43 is coupled between a ground node and the seventh transistor M7. The seventh transistor M7 can be an NMOS transistor, comprising a drain coupled to the first current source 41, a source coupled to the first resistor 43, and a gate coupled to its source. In addition, a connection point 45 of the first current source 41 and the seventh transistor M7 outputs the first bias voltage bias 1.

Figure 4B:
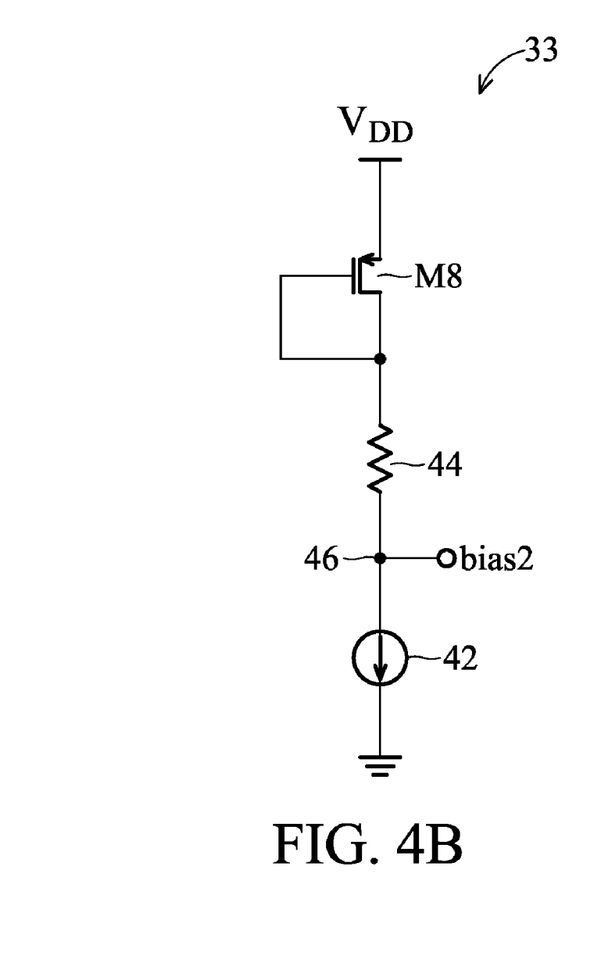
FIG. 4B is a schematic diagram of a second biasing circuit 33 according to an embodiment of the invention.

FIG. 4B is a schematic diagram of a second biasing circuit 33 shown in FIG. 3B according to an embodiment of the invention. The second biasing circuit 33 comprises a second current source 42, a second resistor 44, and an eighth transistor M8. The eighth transistor M8 can be a PMOS transistor, comprising a source coupled to the positive voltage nodes $V_{DD}$, a drain coupled to the second resistor 44, and a gate coupled to its drain. The second current source 42 is coupled to the ground node. The second resistor 44 is coupled between the eighth transistor M8 and the second current source 42. In addition, a second connection point 46 of the second current source 42 and the second resistor 44 outputs the second bias voltage bias2.

Referring to FIGS. 3B and 4B, with the feedback resistor Rf, voltage levels $V_B$ and $V_E$ are the same, thus voltage levels $V_A$, $V_B$ and $V_E$ of FIG. 3B are constant with process variation. In addition, when process variation occurs, the voltage level of the bias2 will follow process variation, such as changing the threshold voltage of the MOS corresponding to different corners SS, SF, FS, and FF, while the voltage level $V_C$ remains constant. Thus, DC bias of the fifth transistor M5 will track DC bias of the fourth transistor M4 by M6. Similarly, DC bias of the second transistor M2 will track DC bias of the first transistor M1 by M3. Thus, third-order intermodulation cancellation tracks process variation, improving circuit linearity.

Figure 5:
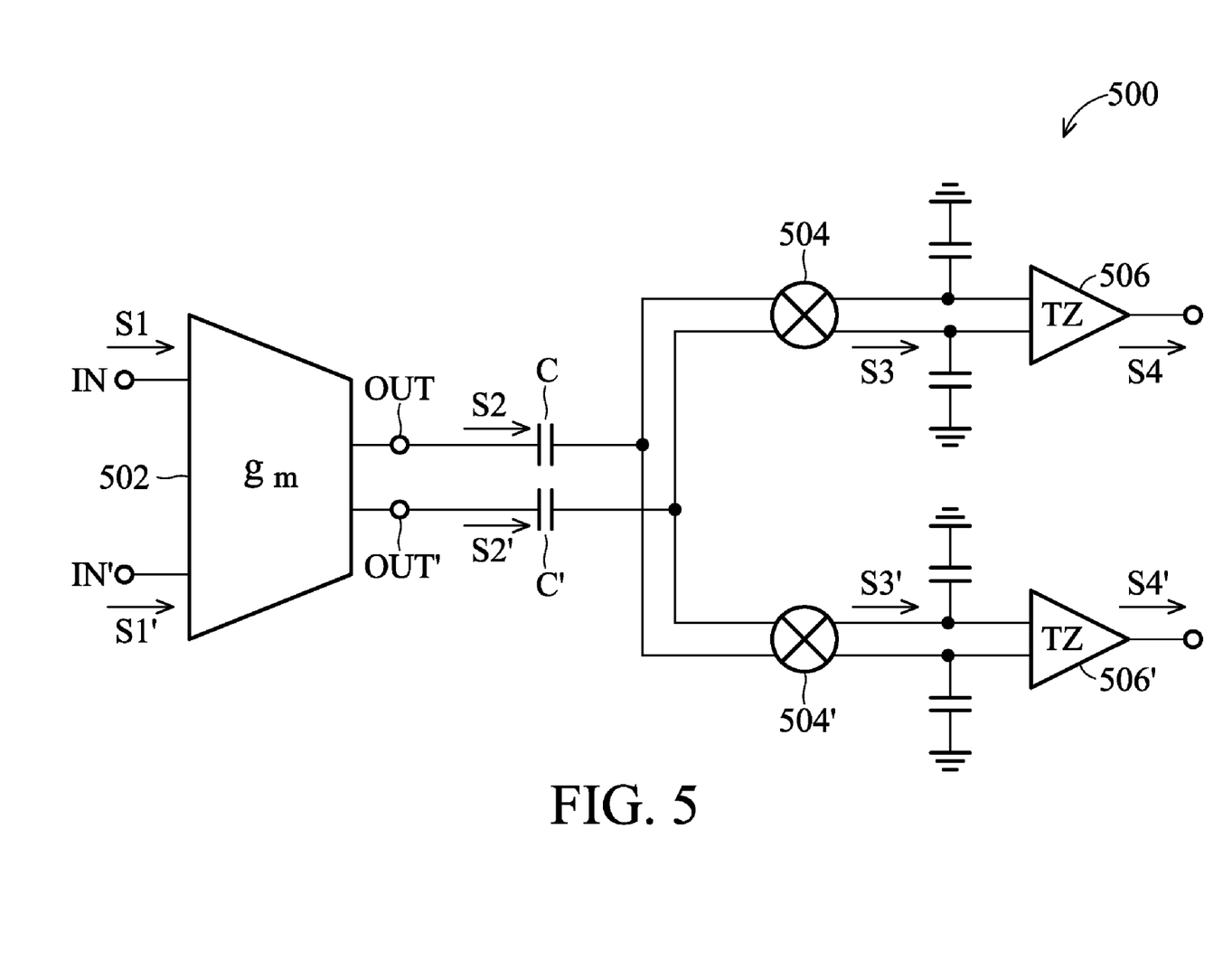
FIG. 5 is a schematic diagram of a mixer according to an embodiment of the invention.

FIG. 5 is a schematic diagram of a mixer according to an embodiment of the invention. The mixer 500 comprises a transconductance stage (gm) 502, a pair of switching quads 504 and 504', and a pair of transimpedance amplifiers (TZ) 506 and 506'. Unlike the mixer 200 shown in FIG. 2, the transconductance stage (gm) 502 comprises a pair of input nodes IN and IN', and a pair of output nodes OUT and OUT'. The transconductance stage 502 receives the input signals S1 and S1' respectively through the input nodes IN and IN', and outputs the output signals S2 and S2' respectively through the output nodes OUT and OUT'. The switching quad 504 is coupled to the output nodes OUT and OUT', and generates a translation current S3 according to the output signals S2 and S2'. The switching quad 504' is coupled to the output nodes OUT and OUT', and generates a translation current S3' according to the output signals S2 and S2'. The transimpedance amplifier 506 transforms the translation current S3 to a corresponding voltage S4. The transimpedance amplifier 506' transforms the translation current S3' to a corresponding voltage S4'. The capacitors C and C' are respectively coupled between the transconductance stage 502 and the switching quads 504 and 504' for respectively coupling AC component of the output signal S2 and S2' to the corresponding switching quads 504 and 504'.

Figure 6:
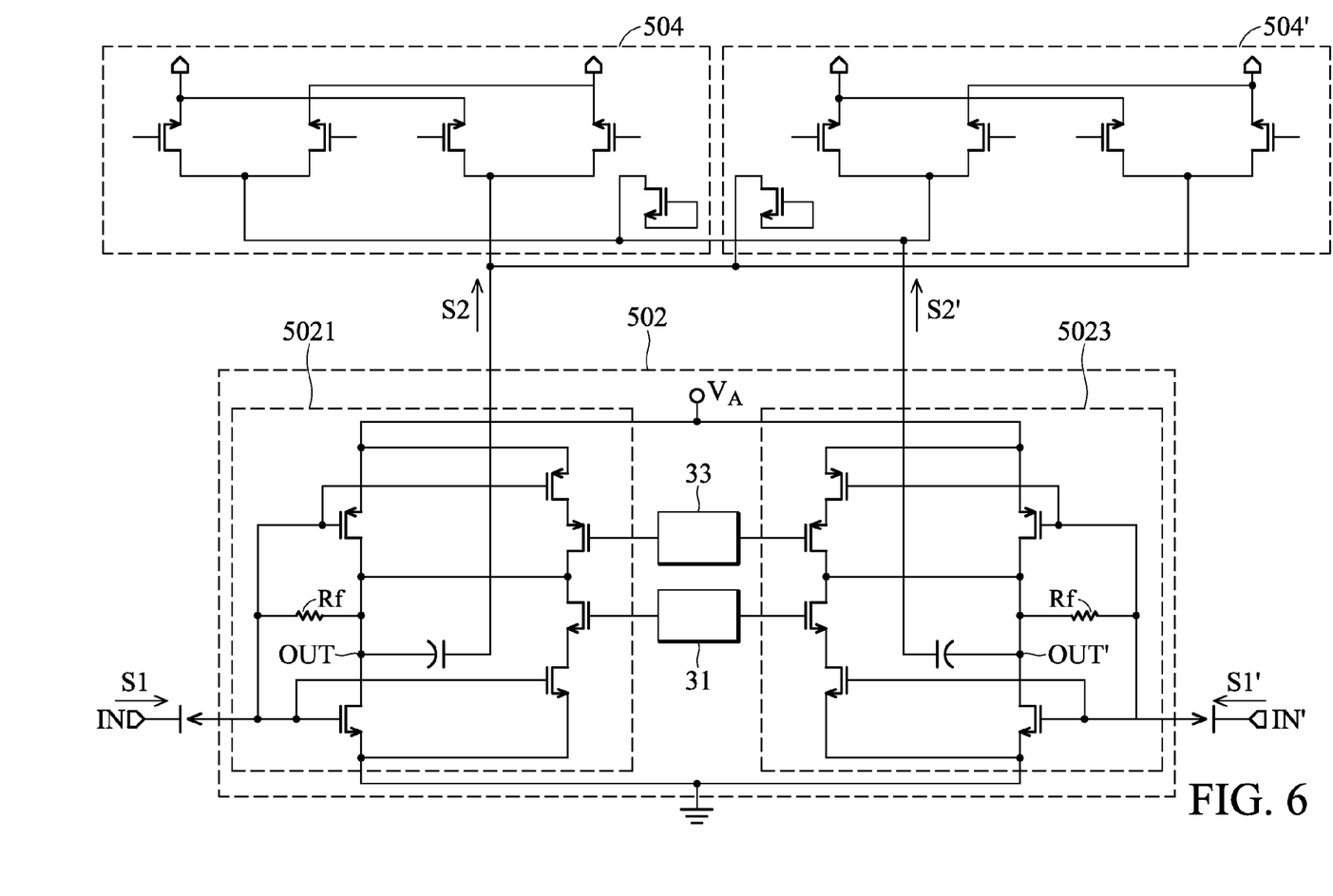
FIG. 6 is a circuit diagram of a mixer 500 according to an embodiment of the invention.

FIG. 6 is a circuit diagram of a mixer 500 according to an embodiment of the invention. In this figure, like numerals are used to designate like or equivalent components of preceding figures. The transconductance stage 502 comprises a first sub-transconductance stage 5021 receiving a first input signal S1 through the input node IN and outputting the output signal S2 through the output node OUT, and a second sub-transconductance stage 5023 receiving a second input signal S1' through the input node S1' and outputting the output signal OUT' through the output node OUT'. The first sub-transconductance stage 5021 and the second sub-transconductance stage 5023 can be identical with the transconductance stages as shown in FIG. 3A or 3B, thus detailed description thereof is omitted for brevity. However, it is noted that there are numerous acceptable variations for implementing the sub-transconductance stages, and the present invention should not be construed so as to be limited to the embodiment disclosed above. For example, the first sub-transconductance stage 5021 and the second sub-transconductance stage 5023 can be with different circuitries. The switching quads 504 and 504' are coupled to the output nodes OUT and OUT'. Since the functionality and operation of the switching quads 504 and 504' are well known to those skilled in the art, detailed description thereof is also omitted for brevity. In addition, the input signals 51 and 51' can be differential signals.

Accordingly, with the circuitry shown in FIGS. 3A and 3B, since the bias voltage provided by the first biasing circuit 31 follows the corner change, the DC bias of the transistor M1 will track that of the transistor M2, and the transistors M1 and M2 respectively operating in a saturation region and sub-threshold region will obtain the output current with inter-modulation cancellation with less interference due to process variation, thus improving circuit linearity.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mixer, comprising:
    a transconductance stage receiving an input signal through an input node and outputting an output signal through an output node, wherein the transconductance stage comprises:
        a first transistor coupled between the output node and a first power node, having a first gate coupled to the input node, and operating in a saturation region, wherein the first transistor is directly connected to the output node;
        a second transistor coupled to the first power node, having a second gate coupled to the input node, and operating in a sub-threshold region;
        a first biasing circuit providing a first bias voltage; and
        a third transistor coupled between the output node and the second transistor, and having a third gate coupled to the first bias voltage;
    a switching quad coupled to the output node and generating a translation current according to the output signal.

2. The mixer as claimed in claim 1, wherein the transconductance stage further comprises:
    a fourth transistor coupled between the output node and a second power node, having a fourth gate coupled to the input node, and operating in the saturation region;
    a fifth transistor coupled to the second power node, having a fifth gate coupled to the input node, and operating in the sub-threshold region;
    a second biasing circuit providing a second bias voltage; and
    a sixth transistor coupled between the output node and the fifth transistor, and having a sixth gate coupled to the second bias voltage.

3. The mixer as claimed in claim 2, wherein the first transistor, the second transistor, the third transistor, the fourth transistor, the fifth transistor and the sixth transistor are MOS transistors.

4. The mixer as claimed in claim 2, wherein the fourth transistor, the fifth transistor and the sixth transistor are PMOS transistors, and the second power node is a first positive voltage node.

5. The mixer as claimed in claim 2, wherein the second biasing circuit comprises:
    an eighth transistor coupled to a second positive voltage node, and having an eighth gate coupled to its drain;
    a second current source coupled to a ground node;
    a second resistor coupled between the eighth transistor and the second current source,
    wherein a second connection point of the second current source and the second resistor outputs the second bias voltage.

6. The mixer as claimed in claim 1, wherein the first transistor, the second transistor and the third transistor are NMOS transistors, and the first power node is a ground node.

7. The mixer as claimed in claim 1, further comprising a capacitor coupled between the output node and the switching quad.

8. The mixer as claimed in claim 1, further comprising a feedback resistor coupled between the output node and the input node.

9. The mixer as claimed in claim 1, wherein the first biasing circuit comprises:
    a first current source coupled to a second positive voltage node;
    a first resistor coupled to a ground node; and
    a seventh transistor coupled between the first current source and the first resistor, and having a seventh gate coupled to its source,
    wherein a first connection point of the first current source and the seventh transistor outputs the first bias voltage.

10. A mixer, comprising:
    a transconductance stage comprising a first sub-transconductance stage receiving a first input signal through a first input node and outputting a first output signal through a first output node, and a second sub-transconductance stage receiving a second input signal through a second input node and outputting a second output signal through a second output node, wherein the first sub-transconductance stage comprises:
        a first transistor coupled between the first output node and a first power node, having a first gate coupled to the first input node, and operating in a saturation region, wherein the first transistor is directly connected to the first output node;
        a second transistor coupled to the first power node, having a second gate coupled to the first input node, and operating in a sub-threshold region;
        a first biasing circuit providing a first bias voltage; and
        a third transistor coupled between the first output node and the second transistor, and having a third gate coupled to the first bias voltage;
    a first switching quad coupled to the first output node and the second output node, generating a first translation current according to the first output signal and the second output signal;

a second switching quad coupled to the first output node and the second output node, generating a second translation current according to the first output signal and the second output signal;

a first transimpedance amplifier transforming the first translation current to a first corresponding voltage; and a second transimpedance amplifier transforming the second translation current to a second corresponding voltage.

11. The mixer as claimed in claim 10, wherein the first sub-transconductance stage further comprises:

a fourth transistor coupled between the first output node and a second power node, having a fourth gate coupled to the first input node, and operating in the saturation region;

a fifth transistor coupled to the second power node, having a fifth gate coupled to the first input node, and operating in the sub-threshold region;

a second biasing circuit providing a second bias voltage; and a sixth transistor coupled between the first output node and the fifth transistor, and having a sixth gate coupled to the second bias voltage.

12. The mixer as claimed in claim 11, wherein the first transistor, the second transistor, the third transistor, the fourth transistor, the fifth transistor and the sixth transistor are MOS transistors.

13. The mixer as claimed in claim 11, wherein the fourth transistor, the fifth transistor and the sixth transistor are PMOS transistors, and the second power node is a first positive voltage node.

14. The mixer as claimed in claim 11, wherein the second biasing circuit comprises:

an eighth transistor coupled to a second positive voltage node, and having an eighth gate coupled to its drain;

a second current source coupled to a ground node;

a second resistor coupled between the eighth transistor and the second current source, wherein a second connection point of the second current source and the second resistor outputs the second bias voltage.

15. The mixer as claimed in claim 10, wherein the first transistor, the second transistor and the third transistor are NMOS transistors, and the first power node is a ground node.

16. The mixer as claimed in claim 10, further comprising a first capacitor coupled between the first output node and the first switching quad.

17. The mixer as claimed in claim 10, further comprising a second capacitor coupled between the second output node and the second switching quad.

18. The mixer as claimed in claim 10, further comprising a feedback resistor coupled between the first output node and the first input node.

19. The mixer as claimed in claim 10, wherein the first biasing circuit comprises:

a first current source coupled to a second positive voltage node;

a first resistor coupled to a ground node; and a seventh transistor coupled between the first current source and the first resistor, and having a seventh gate coupled to its source, wherein a first connection point of the first current source and the seventh transistor outputs the first bias voltage.

20. The mixer as claimed in claim 10, wherein the first input signal and the second input signal are differential signals.

* * * * *